United States Patent [19]

Menniti et al.

[11] Patent Number: 4,733,196
[45] Date of Patent: Mar. 22, 1988

[54] CURRENT GAIN STAGE WITH LOW VOLTAGE DROP

[75] Inventors: Pietro Menniti, Milan; Antonella Lanati, Pavia, both of Italy

[73] Assignee: SGS Microelettronica S.p.A., Catania, Italy

[21] Appl. No.: 937,869

[22] Filed: Dec. 4, 1986

[30] Foreign Application Priority Data

Dec. 23, 1985 [IT] Italy ............................ 23363 A/85

[51] Int. Cl.4 ........................... H03F 3/04; G05F 3/16
[52] U.S. Cl. ..................................... 330/288; 323/315
[58] Field of Search ................ 330/288, 278; 323/315, 323/316

[56] References Cited

U.S. PATENT DOCUMENTS 4,420,725 12/1983 Sueyoshi et al. .................... 330/288

Primary Examiner—Gene Wan
Attorney, Agent, or Firm—Pollock, Vande Sande & Priddy

[57] ABSTRACT

A current gain stage with low voltage drop usable in place of a Darlington's current gain stage is described. This stage maintains the precision characteristics of the output current value, though presenting a lower voltage drop. The stage is formed by connecting the collector of the input transistor (driver) to a current mirror, the output current of which is added to the output current of the gain stage for maintaining the high precision.

3 Claims, 12 Drawing Figures

CURRENT GAIN STAGE WITH LOW VOLTAGE DROP

FIELD OF THE INVENTION

The present invention relates to a current gain stage with low voltage drop and having a high level of precision.

The invention is particularly useful in the field of monolithic integrated circuits, both in integrated systems of the analog type and in integrated systems of the switching or logic type.

BACKGROUND OF THE INVENTION

The common collector connection of two transistor stages—the first of which sees as load the input conductance of the second, called Darlington's connection (Darlington pair)—is widely used in applications where it is necessary to obtain a very small value for the input admittance of an amplifier utilizing semiconductor devices of the bipolar kind.

As it is well known, the current gain stages of a Darlington's pair present a drawback which may exclude their utilization in many applications characterized by peculiar requirements; that is, the voltage between the collector terminal and the emitter terminal of the "equivalent transistor" in the Darlington's arrangement cannot fall below the value of the sum of the $V_{BE}$ of the second transistor ($T_2$ in the figures) and of the $V_{CE}$ of the first transistor ($T_1$ in the figures) in the cascade pair.

In the very frequent case where the output current of the Darlington is utilized, through a current mirror, for driving another circuit of any kind, it is often of fundamental importance that the voltage drop between the terminals C (collector) and E (emitter) of the Darlington be very small in order not to limit excessively the voltage swing, in other words, the dynamic characteristic of the E node or the C node. In fact, the current mirror may have a type of circuit implementation which may be complex; and this may bring forth a certain voltage drop which, summed to the voltage drop of the Darlington (that is between said C and E nodes), may be incompatible with the limit imposed by the supply voltage, which is often of only 5 V.

A similar inconvenient and intolerable excessive limitation of the excursion possibility of the voltage is encountered in output stages which utilize the Darlington's connection and a sensing resistor for detection and control, by a feedback, of the current through the output transistor. Also in this type of application the voltage drop between the C and E nodes of the Darlington limits the maximum voltage developable across the load of the circuit.

With the aim of overcoming such a drawback of Darlington's stages, particularly in circuit situations of the above mentioned type, and thus to reduce the voltage drop of the current gain stage, it is known to connect the collector of the first transistor $T_1$ (driver), not to the collector of the second transistor $T_2$, in accordance with the typical Darlington's connection, but to a circuit block, distinct from the "load" or from the current mirror driven by the output transistor $T_2$, or even directly to the supply line.

This arrangement reduces the minimum voltage between said C and E nodes of the current gain stage only to the $V_{CE}$ voltage of the output transistor $T_2$. But it also leads to the deterioration, though, of the precision of the output current, as it will be better illustrated later in the description. The degree of imprecision which is introduced through said known arrangement is intolerable in many applications.

SUMMARY AND OBJECTIVES OF THE INVENTION

It is therefore a main objective of the present invention to provide a current gain stage with low voltage drop which maintains, at the same time, a high precision of the value of the output current relative to a given input signal substantially equivalent to that offered by a conventional type Darlington's stage.

This objective, as well as other advantages which will become evident through the following description, is achieved, in accordance with the present invention, by means of a current gain stage comprising two transistors $T_1$ and $T_2$ substantially connected in cascade and characterized in that the collector of the first transistor $T_1$ (driver) is connected to a current mirror, the output current of which is then summed to the output current of the gain stage.

The invention and the advantages it offers, with respect to the known techniques in relation to the technical problems discussed above, will be more easily illustrated by reference to a series of circuit diagrams which are herein presented for purely illustrative and non-limitative purposes in the annexed drawings wherein:

DETAILED DESCRIPTION OF THE INVENTION

Figure 1A:
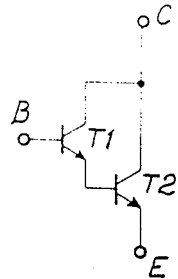
FIGS. 1a and 1b illustrate, respectively, the typical diagrams of a Darlington's type stage and of the equivalent transistor.
Figure 1B:
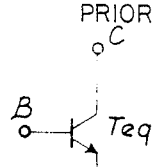

In many applications, the voltage drop across the nodes C and E of a widely used current gain stage of a Darlington pair, the basic diagram of which is shown in FIGS. 1a and 1b, and which cannot be lower than $V_{BET2} + V_{CEsatT1}$, may become excessive.

Figure 2A:
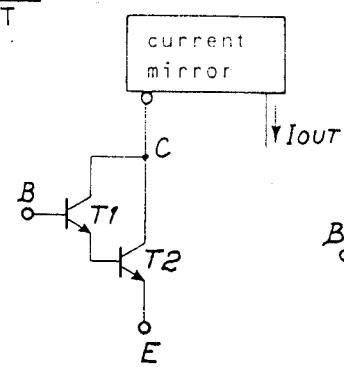
FIGS. 2a and 2b illustrate the relative diagrams of two typical circuit situations utilizing Darlington's type current gain stages.

A situation of this kind may happen, for example, in the case where the output current from the Darlington is utilized, through a current mirror, for driving another circuit of any kind as illustrated in the diagram of FIG. 2a. The current mirror, represented in FIG. 2a by the block bearing the same name, may in fact have a circuit arrangement rather complicated and this may imply a voltage drop which, being added to the voltage drop of the Darlington's stage of current gain, may not be compatible with the available supply voltage. A similar requirement of reducing the voltage drop across the C and E nodes of the current amplifier for allowing a better dynamic characteristic may be present, for example, in the case of an output stage shown in FIG. 2b, which utilizes a Darlington pair, constituted by two transistors $T_1$ and $T_2$, and a sensing resistor $R_S$ for the feedback control of the output current. That is, the voltage drop across C and E nodes of the Darlington limits the maximum excursion of the voltage which may be developed across the load $Z_L$.

Figure 2B:
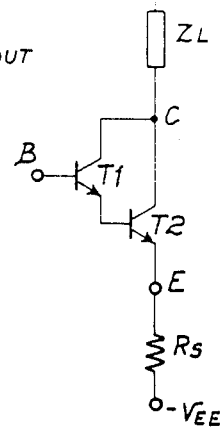
Figure 3A:
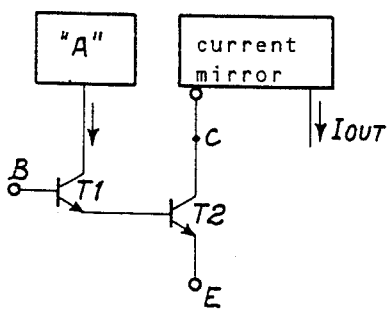
FIGS. 3a and 3b illustrate current gain stages modified in accordance with the prior art technique and utilized, in place of the conventional Darlington's stages, in similar circuit situations of FIGS. 2a and 2b.
Figure 3B:
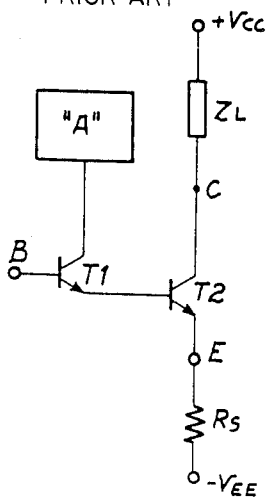

In both cases contemplated in FIGS. 2a and 2b, it is often customary not to connect the collector of transistor $T_1$ (driver) to the collector of the output transistor $T_2$ so as to reduce the voltage drop across the C and E nodes of the current gain stage only to the voltage $V_{CE\text{-}satT2}$ (the saturation voltage collector-emitter of transistor $T_2$) and to connect, instead, the collector of transistor $T_1$ to a circuit block distinct from the load and from the current mirror driven by the current gain stage as shown, respectively, in FIGS. 3a and 3b.

The distinct circuit block, indicated with A in FIGS. 3a and 3b, is often a direct connection of the collector of transistor $T_1$ to the supply line, though it may also have, in general, any suitable circuit arrangement.

This arrangement of the prior art involves, though, an imprecise output current having magnitude equal to the collector current of transistor $T_1$ which, in many instances, cannot be tolerated. An example may be the application wherein the output current has to be set with high precision by controlling the emitter current of the Darlington. In fact, with reference to FIG. 3a, it may be observed that:

$$I_{E2} = I_{C2} + I_{B2}$$

$$I_{C2} = I_{E2} - I_{B2}$$

$$= I_{E2} - I_{E1}$$

$$= I_{E2} - (I_{C1} + I_{B1})$$

$$= I_{E2} - (\beta_1 + 1)I_{B1}$$

wherein the notations are conventional and the suffixes 1 or 2 serve to indicate reference, respectively, to transistors $T_1$ and $T_2$ of the gain stage.

Also in the second of the contemplated instances, with reference to FIG. 3b, it may be observed that the current measured on the sensing resistor $R_S$ will be:

$$I_{E2} = I_{C2} + I_{B2} = I_{C2} + I_{E1}$$

$$= I_L + I_{E1}$$

It is therefore admittedly an error of magnitude equal to the base current of transistor $T_2$ which, under saturation conditions, may not be negligible.

Such problems of loss of precision consequential to the necessity of reducing the voltage drop across the C and E nodes of the current gain stage by connecting the collector of transistor $T_1$ (driver) to a distinct circuit block, are overcome in an effective way by utilizing the current gain stage object of the present invention.

Figure 4A:
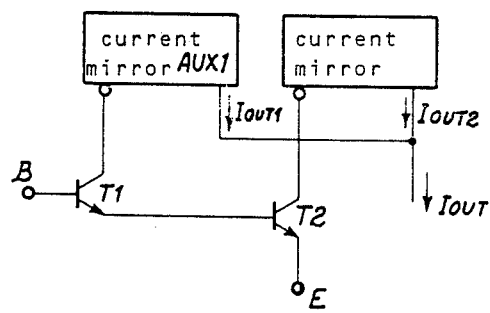
FIGS. 4a and 4b illustrate current gain stages in accordance with the present invention utilized in similar circuit situations as shown in FIGS. 2a, 2b, 3a and 3b.

As schematically illustrated in FIG. 4a which represents the same type of application already examined in the preceding FIGS. 2a and 3a, the current gain stage of the invention contemplates the connection of the collector of transistor $T_1$ (driver) to an auxiliary current mirror AUX 1. The output current of said auxiliary current mirror, $I_{OUT1}$, is then added to the output current, $I_{OUT2}$, of the current mirror driven by the gain stage as a correction current.

In this way, assuming that the current mirrors are precise, it may easily be observed that:

$$I_{OUT} = I_{OUT1} + I_{OUT2}$$

$$I_{OUT1} = I_{C1} = I_{E1} - I_{B1}$$

$$I_{OUT2} = I_{C2} = I_{E2} - I_{B2}$$

and given that:

$$I_{B2} = I_{E1}$$

one has:

$$I_{OUT1} + I_{OUT2} = I_{E1} - I_{B1} + I_{E2} - I_{B2}$$

$$= I_{B2} - I_{B1} + I_{E2} - I_{B2}$$

$$= I_{E2} - I_{B1}$$

Thus, the imprecision of the resulting output current is reduced to a magnitude equal only to the base current of transistor $T_1$ which, as may be evidenced through easy considerations, is inferior by a factor equal to $\beta^2$ with respect to the emitter current of the same transistor $T_2$, and thence such an imprecise result of certainly negligible magnitude.

Figure 4B:
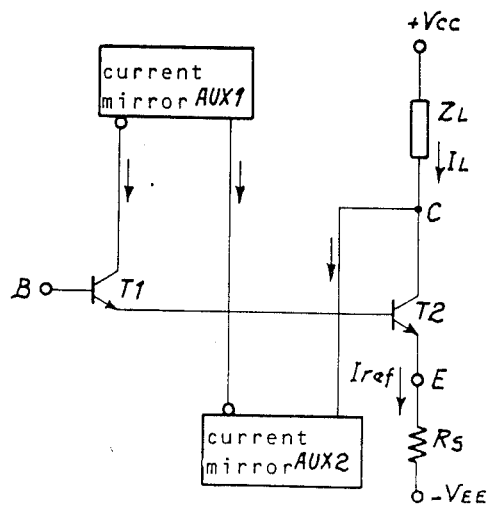

The diagram of FIG. 4b illustrates the current gain stage of the invention applied to the same circuit situation already examined with reference to FIGS. 2b and 3b.

In this instance, the addition of the collector current of transistor $T_1$ to the output current of the current gain stage is made by drawing from node C, that is directly from the load, using a second auxiliary current mirror AUX 2, having a current equal to the collector current of transistor $T_1$. Also in this instance, assuming the current mirrors are precise, it may easily be observed that:

$$I_L = I_{C2} + I_{E1}$$

$$I_{sens} = I_{E2} = I_{C2} + I_{C1} + I_{B1}$$

$$= I_L + I_{B1}$$

This results in the imprecision of the output current being of a magnitude equal to the base current $I_{B1}$ of transistor $T_1$ (driver), which is practically negligible.

The description proceeds now to illustrate typical examples of circuit situations wherein the gain stage of the present invention would find particularly effective utilization.

Figure 5:
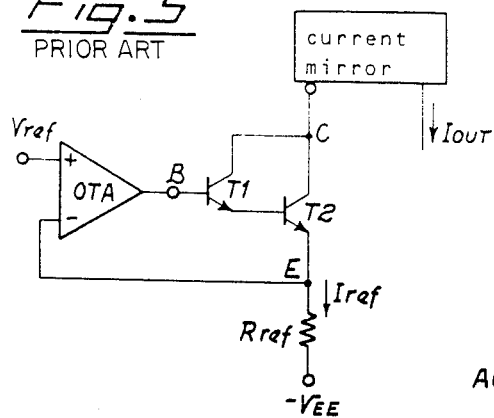
FIG. 5 illustrates the diagram of a circuit using a Darlington, which is often found in many integrated systems.

In some integrated circuits it may be necessary to set from outside, by means of a reference voltage and/or resistor $R_{ref}$, a current for internal uses. In these instances, the typical structure is the one shown in FIG. 5, wherein it may be observed that a current gain stage of the Darlington pair follows a differential stage (input transconductance stage) OTA for driving the output current mirror.

The reference voltage $V_{ref}$, applied across the reference resistor $R_{ref}$, sets the emitter current of transistor $T_2$.

Therefore, the value of the output current $I_{OUT}$ should be as close to the value of the current $I_{ref}$ as possible.

The maximum value admitted for the voltage $V_{ref}$ is:

$$V_{ref,max} = V_s - (V_{BET2} + V_{CEsatT1}) - V_{ds}$$

where:

$V_s$ = supply voltage and $V_{ds}$ = minimum drop necessary for the operation of the output current mirror.

Generally, the selection of a certain current mirror is dictated by precision requirements because, normally, a current mirror with high precision characteristics has a more complex circuit and therefore necessarily presents a higher voltage drop. It is common practice, therefore, to reduce the voltage drop (due to the current gain stage) so as to make it, to the limit, equal only to the value $V_{CEsatT2}$, in accordance with the technique described in relation to FIG. 3a. But that, as has been observed, implies the introduction of a non-negligible imprecision in the transfer of the data (that is, imprecision of $I_{OUT}$ as a function of $V_{ref}$).

Figure 6:
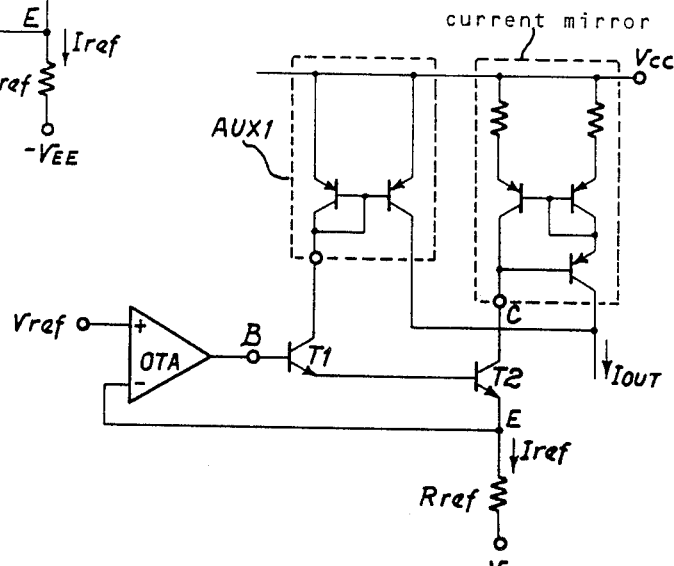
FIG. 6 illustrates the application of the current gain stage of the invention in the circuit of FIG. 5.

The application of the current gain stage of the invention in this particular instance may be implemented as shown in the diagram of FIG. 6 wherein the symbols and the designations of the various components (or blocks) are the same as those used in the preceding figures and wherein the output current mirror and the auxiliary current mirror AUX 1 are shown according to one of the possible circuit implementations of the same.

As may be easily observed, the utilization of the current gain stage of the invention in this specific instance allows an increase of the superior limit for the voltage $V_{ref}$, or results in employing a more complex current mirror (more precise) at the output, for example, as shown in FIG. 6, a Wilson's mirror which is an extremely precise mirror that requires larger dynamics.

Figure 7:
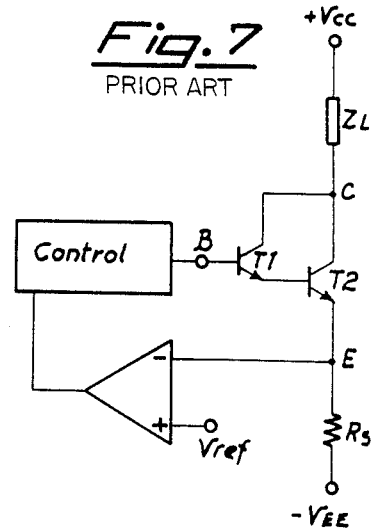
FIG. 7 illustrates another diagram of another circuit using a Darlington which is often employed in many integrated systems of the digital or switching type.

In integrated systems of the switching kind, the output current, that is the current supplied by the current gain stage to a load $Z_L$, is controlled under feedback by means of the voltage drop measured across the sensing resistor $R_S$ and by comparing with a reference voltage $V_{ref}$ as shown in the diagram of FIG. 7.

Figure 8:
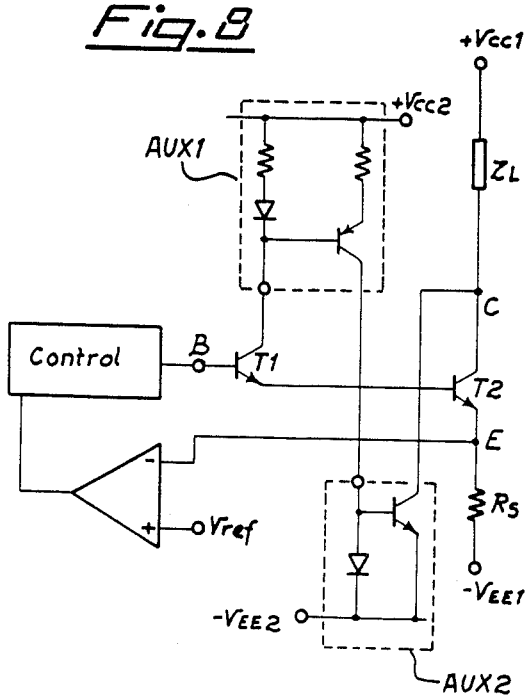
FIG. 8 illustrates the application of the current gain stage of the invention in the circuit of FIG. 7.

Utilizing in place of the Darlington pair of FIG. 7 the current gain stage of the invention, as shown in FIG. 8, it is possible to increase the voltage applied to the load $Z_L$, thus reducing the minimum drop of the gain stage only to $V_{CEsatT2}$, though maintaining a high level of precision in the output current. In fact, the collector current of transistor $T_1$ (driver) is added directly across the load $Z_L$ to the output current of transistor $T_2$ by mirroring the collector current of $T_1$ through the two auxiliary current mirrors AUX 1 and AUX 2 identified, respectively, by the two dash line rectangles of FIG. 8.

What we claim is:

1. A current gain stage having an input terminal and an output terminal and operable to produce an output current which is a precise amplified replica of a current applied to said input terminal, said current gain stage comprising:

a first transistor and a second transistor substantially connected in cascade, each of said transistors having a load connected to its collector, the base of said first transistor constituting said input terminal and the collector of said second transistor constituting said output terminal, each of said transistors having respective collector currents;

wherein the collector load of said first transistor is a current mirror operable to produce an output current equal to the collector current of said first transistor; and wherein the output current of said current mirror is added to the collector current of said second transistor.

2. The current gain stage of claim 1, further comprising:

a second current mirror driven by the collector current of said second transistor and operable to produce an output current equal to the collector current of said second transistor; and wherein the output current of said current mirror is added to the output current of said second current mirror.

3. The current gain stage of claim 1, further comprising:

a second current mirror driven by the output current of said current mirror driven by the collector current of said first transistor; and wherein the output current of said second current mirror is added directly to the current passing through the load connected to the collector of said second transistor.

* * * * *